(12) United States Patent
Yamakawa

(10) Patent No.: US 10,412,828 B1
(45) Date of Patent: Sep. 10, 2019

(54) WIRING SUBSTRATE

(71) Applicant: SHINKO ELECTRIC INDUSTRIES CO., LTD., Nagano-shi, Nagano-ken (JP)

(72) Inventor: Kaoru Yamakawa, Nagano (JP)

(73) Assignee: SHINKO ELECTRIC INDUSTRIES CO., LTD. (JP)

( * ) Notice: Subject to any disclaimer, the term of this patent is extended or adjusted under 35 U.S.C. 154(b) by 0 days.

(21) Appl. No.: 16/361,299

(22) Filed: Mar. 22, 2019

(30) Foreign Application Priority Data

Mar. 30, 2018 (JP) .................................. 2018-067912

(51) Int. Cl.
| | |
|---|---|
| H05K 1/02 | (2006.01) |
| H01L 23/00 | (2006.01) |
| H01L 23/498 | (2006.01) |
| H05K 1/11 | (2006.01) |

(52) U.S. Cl.
CPC ...... *H05K 1/0298* (2013.01); *H01L 23/49811* (2013.01); *H01L 23/49822* (2013.01); *H01L 23/49838* (2013.01); *H01L 23/49894* (2013.01); *H01L 23/562* (2013.01); *H05K 1/115* (2013.01); *H01L 24/16* (2013.01); *H01L 2224/16227* (2013.01)

(58) Field of Classification Search
CPC .... H05K 1/0296; H05K 1/0298; H05K 1/115; H05K 1/116
See application file for complete search history.

(56) References Cited

FOREIGN PATENT DOCUMENTS

| JP | 2009123874 A | 6/2009 |
|---|---|---|
| JP | 2015176984 A | 10/2015 |

*Primary Examiner* — Jeremy C Norris
(74) *Attorney, Agent, or Firm* — Tarolli, Sundheim, Covell & Tummino LLP

(57) ABSTRACT

A wiring substrate includes a substrate body, a first wiring, and a second wiring. The first wiring and the second wiring are located on an upper surface of the substrate body. The wiring substrate further includes a solder resist layer that covers the first wiring and the second wiring. The solder resist layer includes a first opening that partially exposes the second wiring and a missing portion that partially exposes the first wiring. The wiring substrate further includes an insulation coating that covers an inner wall of the missing portion, the first wiring exposed by the missing portion, and at least a portion of an upper surface of the solder resist layer. The insulation coating includes a second opening that is in communication with the first opening and partially exposes the second wiring.

7 Claims, 10 Drawing Sheets

(Comparative Example)

WIRING SUBSTRATE

CROSS-REFERENCE TO RELATED APPLICATIONS

This application is based upon and claims the benefit of priority from prior Japanese Patent Application No. 2018-067912, filed on Mar. 30, 2018, the entire contents of which are incorporated herein by reference.

FIELD

This disclosure relates to a wiring substrate and a method for manufacturing a wiring substrate.

BACKGROUND

An electronic device including a semiconductor element such as a CPU is mounted on a wiring substrate. Reduction in the thickness of the electronic device reduces the thickness of the wiring substrate. In such a wiring substrate, a reinforcement plate is used to limit warping of the wiring substrate caused by the reduction in thickness (refer to Japanese Laid-Open Patent Publication Nos. 2009-123874 and 2015-176984).

SUMMARY

A conductive reinforcement plate may be connected to a wiring pattern (e.g., ground pattern) of a wiring substrate. In this case, a conductive paste is used so that the conductive reinforcement plate adheres to a solder resist layer of the wiring substrate and is electrically connected to the wiring pattern of the wiring substrate. However, the solder resist layer may include an unnecessary opening (void), and such an opening may expose a wiring pattern that is not intended to be connected to the conductive reinforcement plate. In this case, the unintended wiring pattern which is exposed in the opening may be electrically connected to the conductive reinforcement plate by the conductive paste. This causes an undesirable short-circuiting between the unintended wiring and, for example, a ground pattern.

One embodiment is a wiring substrate that includes a substrate body, a first wiring and a second wiring, a solder resist layer, and an insulation coating. The first wiring and the second wiring are located on an upper surface of the substrate body. The solder resist layer covers the first wiring and the second wiring. The solder resist layer includes a first opening that partially exposes the second wiring and a missing portion that partially exposes the first wiring. The insulation coating covers an inner wall of the missing portion, the first wiring exposed by the missing portion, and at least a portion of an upper surface of the solder resist layer. The insulation coating includes a second opening that is in communication with the first opening and partially exposes the second wiring.

Another embodiment is a method for manufacturing a wiring substrate. The method includes forming a first wiring and a second wiring on an upper surface of a substrate body, and forming a solder resist layer covering the first wiring and the second wiring, the solder resist layer including a first opening that partially exposes the second wiring. The method further includes forming an insulation coating covering an inner wall of a missing portion formed in the solder resist layer, the first wiring exposed by the missing portion, and at least a portion of an upper surface of the solder resist layer. The insulation coating includes a second opening that is in communication with the first opening and partially exposes the second wiring.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Figure 1:
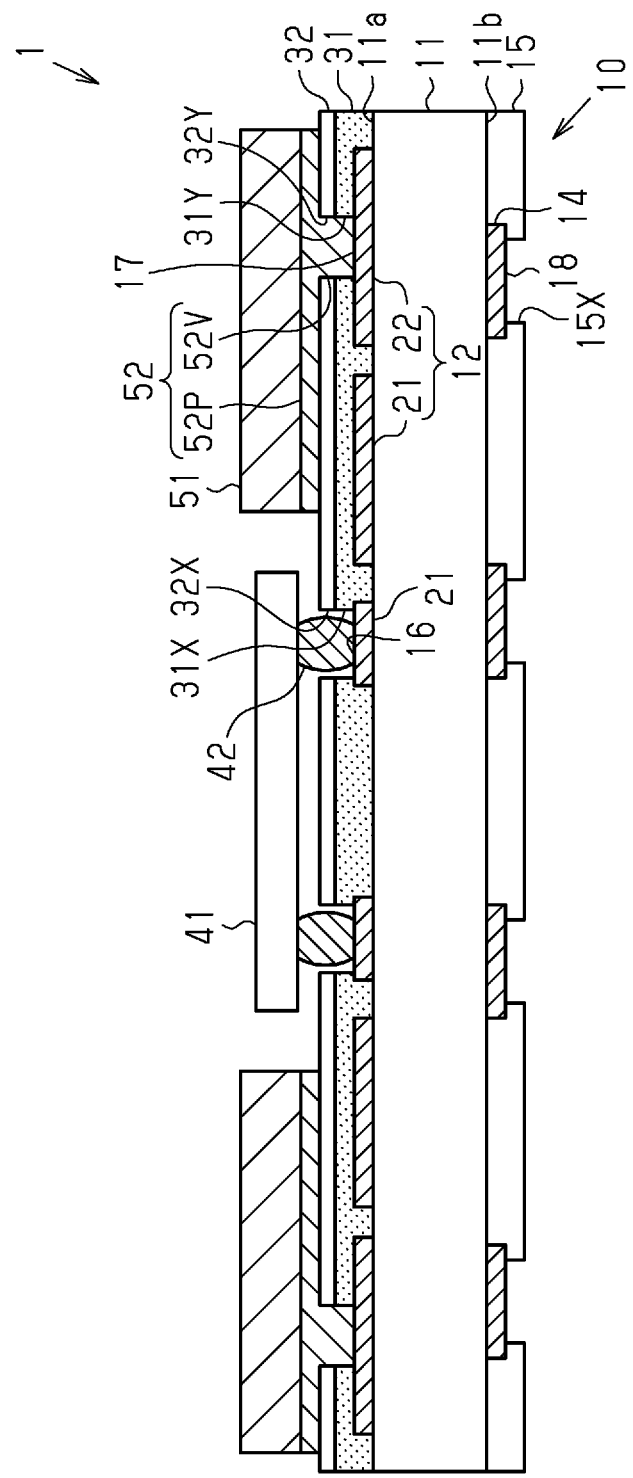
FIG. 1 is a schematic cross-sectional view of a semiconductor device according to a first embodiment.

Various embodiments will now be described with reference to the drawings. Elements in the drawings may be partially enlarged and thus have not necessarily been drawn to scale. To facilitate understanding, hatching lines may be illustrated in the plan drawings. The hatching lines may not be illustrated or be replaced by shadings in the cross-sectional drawings.

First Embodiment

A first embodiment will now be described with reference to FIGS. 1 to 12.

As illustrated in FIG. 1, a semiconductor device 1 includes a wiring substrate 10, a semiconductor element 41 as an electronic component, a conductive reinforcement plate 51, and a conductive adhesive layer 52.

Figure 3:
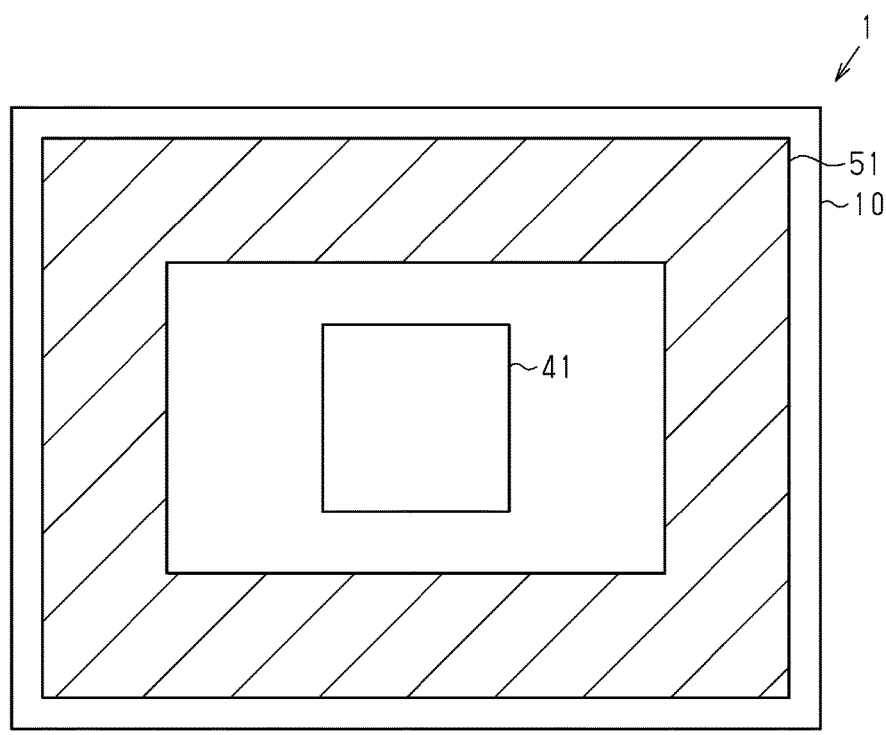
FIG. 3 is a schematic plan view of the semiconductor device illustrated in FIG. 1.

As illustrated in FIGS. 1 and 3, the wiring substrate 10 is rectangular. The semiconductor element 41 is mounted on the wiring substrate 10. The conductive reinforcement plate 51 is connected to the wiring substrate 10 by the conductive adhesive layer 52. The conductive reinforcement plate 51 has the form of a frame extending along the sides of the wiring substrate 10. The conductive reinforcement plate 51 surrounds the semiconductor element 41 mounted on the wiring substrate 10.

Figure 2:
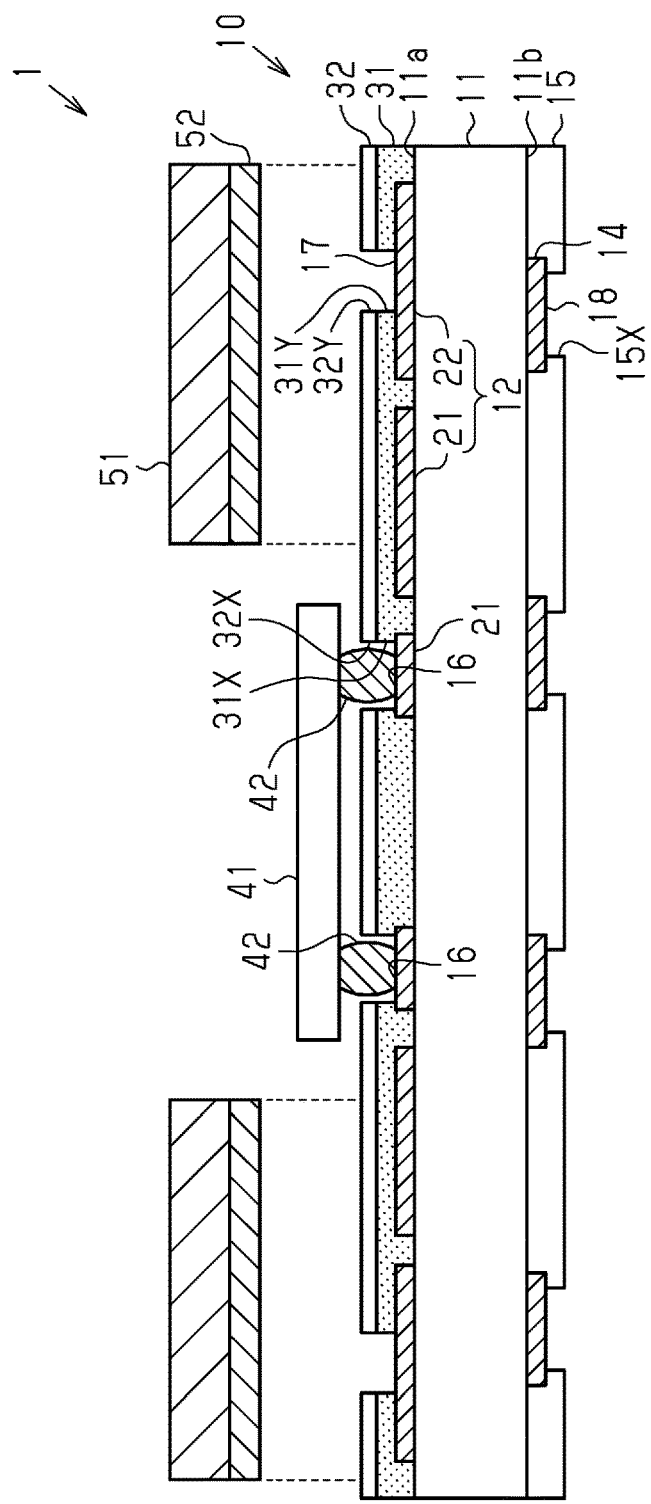
FIG. 2 is a schematic cross-sectional view of a wiring substrate and a reinforcement plate in the semiconductor device illustrated in FIG. 1.

As illustrated in FIGS. 1 and 2, the wiring substrate 10 includes a substrate body 11, a wiring layer 12, a solder resist layer 31, an insulation coating 32, a wiring layer 14, and a solder resist layer 15.

The wiring layer 12 is formed on an upper surface 11a of the substrate body 11. The wiring layer 14 is formed on a lower surface 11b of the substrate body 11. For example, copper (Cu) may be used as the material of the wiring layers 12 and 14.

The substrate body 11 may have any structure as long as the structure electrically connects the wiring layers 12 and 14 to each other. For example, the substrate body 11 may or may not include one or more internal wiring layers. For example, the substrate body 11 may include internal wiring layers and insulation layers that are alternately stacked. In this case, the wiring layers 12 and 14 may be electrically connected to each other by via wirings formed in the insulation layers and the internal wiring layers. For example, copper or a copper alloy may be used as the material of the inner wiring layers and the via wirings. The material of the insulation layers may be, for example, an insulative resin such as an epoxy resin or a polyimide resin or a resin material in which the insulative resin is mixed with a filler such as silica or alumina. The substrate body 11 may be, for example, a coreless substrate, which does not include a core substrate, or a build-up core substrate, which includes a core substrate. For example, a silicon substrate or a ceramic substrate may be used as the substrate body 11.

The wiring layer 12 includes first wirings 21 and second wirings 22. The first wiring 21 is, for example, a signal wiring that transmits a signal. In the description hereafter, the first wiring 21 may be referred to as the signal wiring 21. The second wiring 22 is, for example, a ground wiring that is connected to ground. In the description hereafter, the second wiring 22 may be referred to as the ground wiring 22.

The solder resist layer 31 covers the upper surface 11a of the substrate body 11 and a portion of the wiring layer 12. The solder resist layer 31 includes openings 31X and 31Y partially exposing the wiring layer 12. The openings 31X partially expose the signal wiring 21 of the wiring layer 12 as connection pads 16. The openings 31Y partially expose the ground wiring 22 of the wiring layer 12 as ground pads 17. The solder resist layer 31 is a resin insulation layer formed from an insulative resin. The material of the solder resist layer 31 may be, for example, an epoxy resin or an acrylic resin.

If necessary, OSP may be performed to form an OSP film on the surface of the wiring layer 12 exposed in the openings 31X and 31Y of the solder resist layer 31. Alternatively, a metal layer may be formed on the wiring layer 12 exposed in the openings 31X and 31Y. Examples of the metal layer include a Au layer, a Ni layer/Au layer (metal layer in which the Ni layer serves as the bottom layer, and the Ni layer and the Au layer are sequentially stacked on the wiring layer 12), and a Ni layer/Pd layer/Au layer (metal layer in which the Ni layer severs as the bottom layer, and the Ni layer, the Pd layer, and the Au layer are sequentially stacked on the wiring layer 12). Thus, the wiring layer 12 exposed in the openings 31X and 31Y or the OSP film or the metal layer formed on the wiring layer 12 may be used as the pads.

The insulation coating 32 covers the upper surface of the solder resist layer 31. The insulation coating 32 includes openings 32X and openings 32Y. The openings 32X are in communication with the openings 31X of the solder resist layer 31 and partially expose the signal wiring 21 (i.e., the connection pads 16) of the wiring layer 12. The openings 32Y are in communication with the openings 31Y of the solder resist layer 31 and partially expose the ground wiring 22 (i.e., the ground pads 17) of the wiring layer 12. The insulation coating 32 is an alumina insulation layer formed from insulative alumina ($Al_2O_3$). Alternatively, a silicon oxide film ($SiO_2$) may be used as the insulation coating 32.

The semiconductor element 41 is connected to the connection pads 16 of the wiring substrate 10 by bumps 42. The semiconductor element 41 is flip-chip-mounted on the wiring substrate 10. The semiconductor element 41 may be, for example, a logic chip such as a central processing unit (CPU) chip or a graphics processing unit (GPU) chip. The semiconductor element 41 may be, for example, a memory chip such as a dynamic random access memory (DRAM) chip, a static random access memory (SRAM) chip, or a flash memory chip. The semiconductor element 41 may be a system chip including a CPU or other digital and analog circuits.

The bumps 42 may be bumps located on the connection pads 16, bumps located on the semiconductor element 41, or both the bumps. The bumps 42 may be, for example, gold bumps or solder bumps. The material of the solder bumps may be, for example, an alloy containing lead (Pb), an alloy of tin (Sn) and gold (Au), an alloy of Sn and Cu, an alloy of Sn and silver (Ag), or an alloy of Sn, Ag, and Cu.

The semiconductor element 41 is one example of the electronic component. Instead of the semiconductor element 41, for example, another electronic component such as a capacitor or an inductor may be mounted on the wiring substrate 10. Further, multiple electronic components may be mounted on the wiring substrate 10. Additionally, the gap between the wiring substrate 10 (insulation coating 32) and the semiconductor element 41 may be filled with an underfill resin. The underfill resin may be, for example, an insulative resin such as an epoxy resin.

The solder resist layer 15 covers the lower surface of the substrate body 11 and a portion of the wiring layer 14. The solder resist layer 15 includes openings 15X partially exposing the wiring layer 14 as external connection pads 18. The material of the solder resist layer 15 may be, for example, an insulative resin such as an epoxy resin or an acrylic resin.

The external connection pads 18 are connected to external connection terminals used when the wiring substrate 10 is mounted on a mount board (not illustrated) such as a motherboard. The external connection terminals may be, for example, solder balls, solder bumps, or lead pins.

If necessary, OSP may be performed to form an OSP film on the surface of the wiring layer 14 exposed in the openings 15X of the solder resist layer 15. Alternatively, a metal layer may be formed on the wiring layer 14 exposed in the openings 15X. Examples of the metal layer include a Au layer, a Ni layer/Au layer (metal layer in which the Ni layer serves as the bottom layer, and the Ni layer and the Au layer are sequentially stacked on the wiring layer 14), or a Ni layer/Pd layer/Au layer (metal layer in which the Ni layer serves as the bottom layer, and the Ni layer, the Pd layer, and the Au layer are sequentially stacked on the wiring layer 12). Thus, the wiring layer 14 exposed in the openings 15X or the metal layer or the OSP film formed on the wiring layer 14 may be used as the external connection terminals.

As illustrated in FIG. 1, the conductive reinforcement plate 51 is adhered to the upper surface of the insulation coating 32 on the wiring substrate 10 by the conductive adhesive layer 52. The conductive reinforcement plate 51 extends over and covers the opening 31Y in the solder resist layer 31, the opening 32Y in the insulation coating 32, at least a portion of the signal wiring 21, and at least a portion of the ground wiring 22 in a plan view. Thus, the conductive adhesive layer 52, the insulation coating 32, the solder resist layer 31, at least a portion of the signal wiring 21, and at least a portion of the ground wiring 22 are arranged between the conductive reinforcement plate 51 and the substrate body 11. The conductive reinforcement plate 51 is formed by a plate of, for example, Cu, a Cu alloy, iron (Fe), or stainless steel. The insulation coating 32 is, for example, an alumina insulation layer.

The conductive adhesive layer 52 includes an adhesive layer 52P and connecting portions 52V. The adhesive layer 52P is located between the insulation coating 32 and the conductive reinforcement plate 51. The connecting portions 52V are formed in the openings 31Y of the solder resist layer 31 and the openings 32Y of the insulation coating 32. The connecting portions 52V are connected to the ground pads 17 exposed in the openings 31Y and 32Y. Thus, the conductive reinforcement plate 51 is connected to the ground wiring 22 by the conductive adhesive layer 52. The conductive adhesive layer 52 is formed, for example, by curing a conductive paste (e.g., Ag paste).

Examples of dimensions of each member in the wiring substrate 10 will now be described. The thickness of the substrate body 11 is, for example, 0.7 mm. The thickness of the conductive reinforcement plate 51 is, for example, 0.5 mm. The thickness of the conductive adhesive layer 52 (adhesive layer 52P) is, for example, 20 μm. The thickness of the insulation coating 32 is, for example, 1 μm. The thickness of the solder resist layer 31 is, for example, 20 μm.

A comparative example of a wiring substrate 100 will now be described with reference to FIG. 5. The same reference characters are given to those members that are the same as the corresponding members of the above embodiment.

Figure 5:
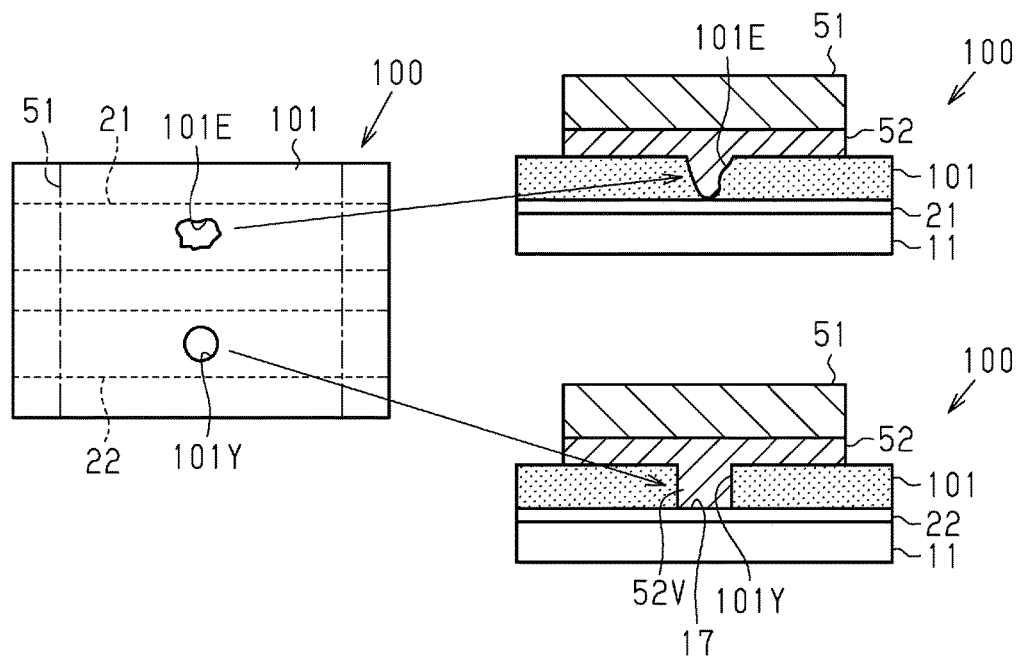
FIG. 5 is an illustrative diagram illustrating a solder resist layer of a wiring substrate according to a comparative example.

The left part in FIG. 5 is a plan view illustrating a portion of the wiring substrate 100. The upper right part in FIG. 5 is a cross-sectional view illustrating a portion of the wiring substrate 100 including the signal wiring 21. The lower right part of FIG. 5 is a cross-sectional view illustrating a portion of the wiring substrate 100 including the ground wiring 22.

The wiring substrate 100 includes a solder resist layer 101, which is a single resin insulation layer. The solder resist layer 101 includes an opening 101Y partially exposing the ground wiring 22 as a ground pad 17. The ground pad 17 is connected to the conductive reinforcement plate 51 by the conductive adhesive layer 52.

The solder resist layer 101 is formed, for example, by applying a liquid or paste of an insulative resin and curing the insulative resin. When the solder resist layer 101 has a missing portion 101E (void), the missing portion 101E may expose an unintended wiring portion. For example, as illustrated in the upper right part in FIG. 5, when the solder resist layer 101 has the missing portion 101E in a region where the signal wiring 21 exists, the conductive adhesive layer 52 formed in the missing portion 101E may connect the conductive reinforcement plate 51 to the signal wiring 21. The conductive reinforcement plate 51 is connected to the ground wiring 22 by the connecting portion 52V (conductive adhesive layer 52) formed in the opening 101Y of the solder resist layer 101. Thus, the signal wiring 21 and the ground wiring 22 short-circuit.

Figure 4:
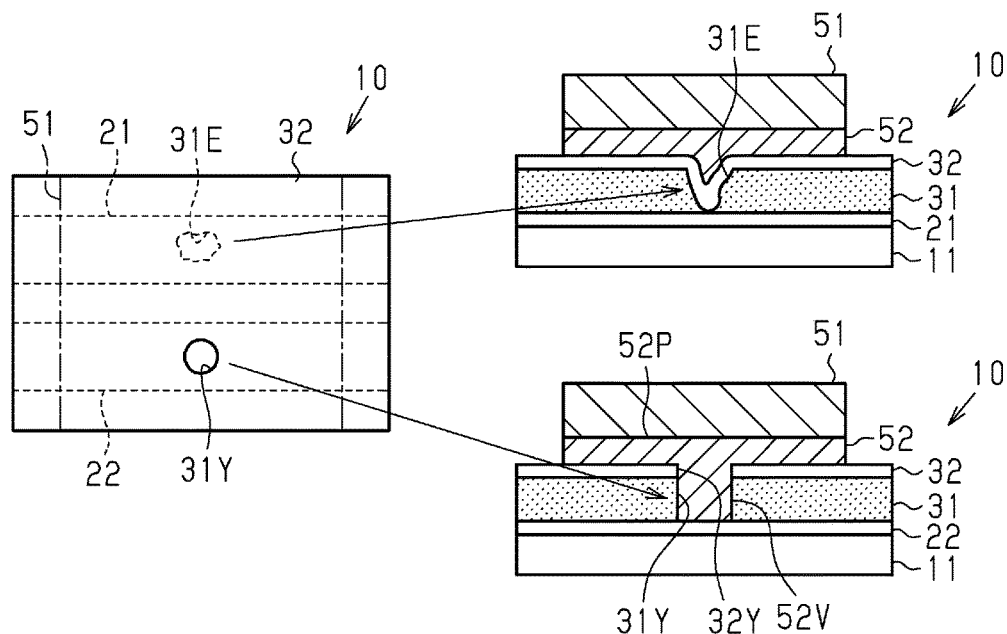
FIG. 4 is an illustrative diagram of a solder resist layer of the wiring substrate illustrated in FIG. 2.

The left part in FIG. 4 is a plan view illustrating a portion of the wiring substrate 10. The upper right part in FIG. 4 is a cross-sectional view illustrating a portion of the wiring substrate 10 including the signal wiring 21. The lower right part in FIG. 4 is a cross-sectional view illustrating a portion of the wiring substrate 10 including the ground wiring 22.

In the wiring substrate 10, the insulation coating 32 covers the entire upper surface of the solder resist layer 31. The solder resist layer 31 is, for example, a resin insulation layer. The insulation coating 32 is, for example, an alumina insulation layer. As illustrated in the upper right part in FIG. 4, the solder resist layer 31 may have a missing portion 31E in an unintended position, for example, a position of the signal wiring 21. In this case, the insulation coating 32 covers the inner wall of the missing portion 31E and the signal wiring 21 exposed by the missing portion 31E in addition to the entire upper surface of the solder resist layer 31. Thus, even when the missing portion 31E is filled with the conductive adhesive layer 52, the insulation coating 32 is located between the conductive adhesive layer 52 and the signal wiring 21, and the conductive reinforcement plate 51 is not electrically connected to the signal wiring 21. This limits short-circuiting of the signal wiring 21 and the ground wiring 22.

A method for manufacturing the wiring substrate 10 and the semiconductor device 1 will now be described. Formation of the solder resist layer 31 and the insulation coating 32 and adhesion of the conductive reinforcement plate 51, which are illustrated in FIGS. 1 and 2, will be described. To facilitate understanding, portions that ultimately become elements of the wiring substrate 10 and the semiconductor device 1 are indicated by reference characters used to denote the final elements.

FIGS. 6 to 11 illustrate steps of forming the solder resist layer 31 and the insulation coating 32. FIG. 12 illustrates a step of connecting the conductive reinforcement plate 51. In each of FIGS. 6 to 12, the left part is a plan view illustrating a portion of the structure obtained in the corresponding step. The upper right part is a cross-sectional view illustrating a portion of the structure including the signal wiring 21. The lower right part is a cross-sectional view illustrating a portion of the structure including the ground wiring 22.

Figure 6:
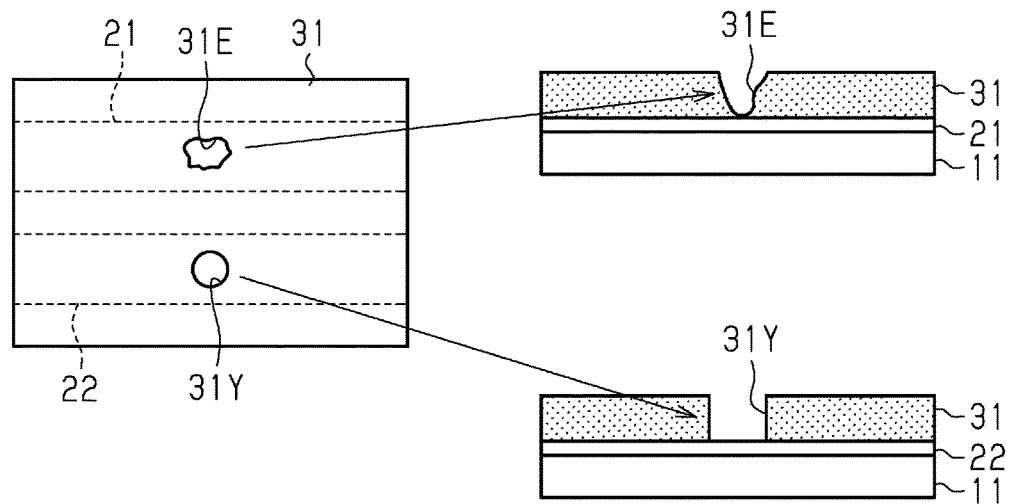
FIGS. 6 to 11 are illustrative diagrams illustrating steps of forming a solder resist layer and an insulation coating.

As illustrated in FIG. 6, the solder resist layer 31 is formed to cover the wiring layer 12 (signal wiring 21 and ground wiring 22). The solder resist layer 31 includes the openings 31Y partially exposing the ground wiring 22. The solder resist layer 31 is formed, for example, by applying a liquid or paste of a photosensitive resin and patterning the photosensitive resin into a desired shape through exposure and development of photolithography. FIG. 6 illustrates a case in which the solder resist layer 31 that covers the signal wiring 21 has the missing portion 31E (void).

Figure 7:
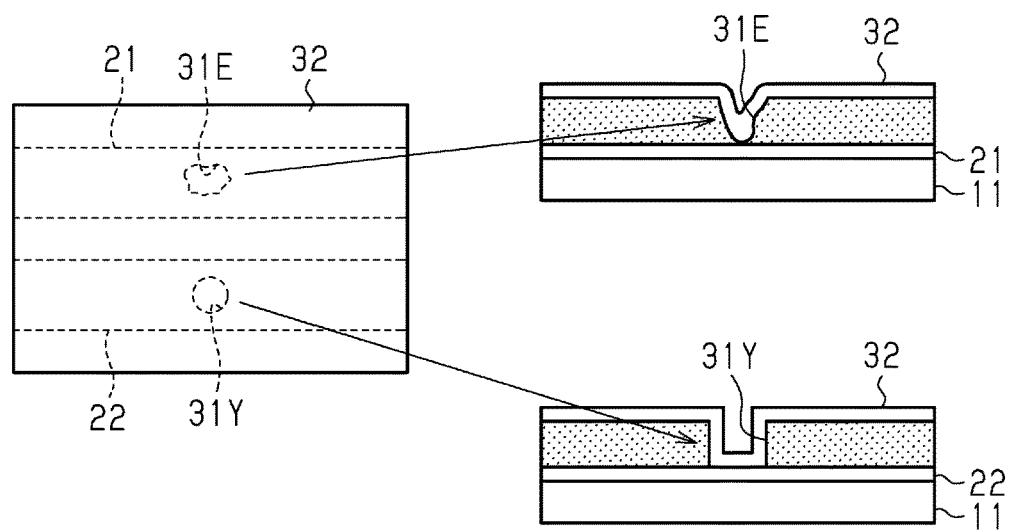

As illustrated in FIG. 7, the insulation coating 32 is formed to cover the upper surface of the solder resist layer 31. The insulation coating 32 is, for example, an alumina insulation layer formed by sputtering. The sputtering allows the insulation coating 32 to cover the inner wall of the missing portion 31E formed in the solder resist layer 31 and the signal wiring 21 exposed by the missing portion 31E. When the insulation coating 32 is, for example, a silicon oxide film, for example, TEOS may be used to form the insulation coating 32.

Figure 8:
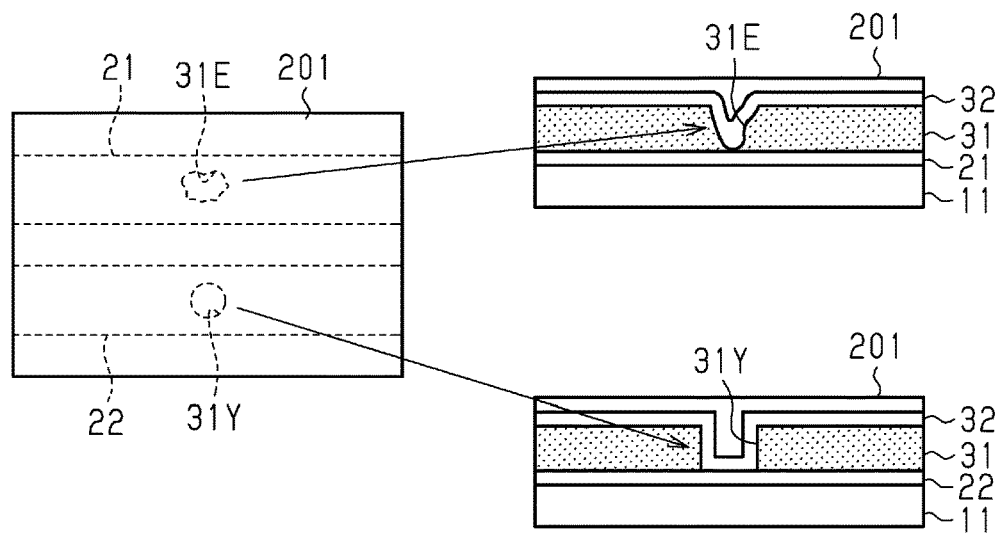
Figure 10:
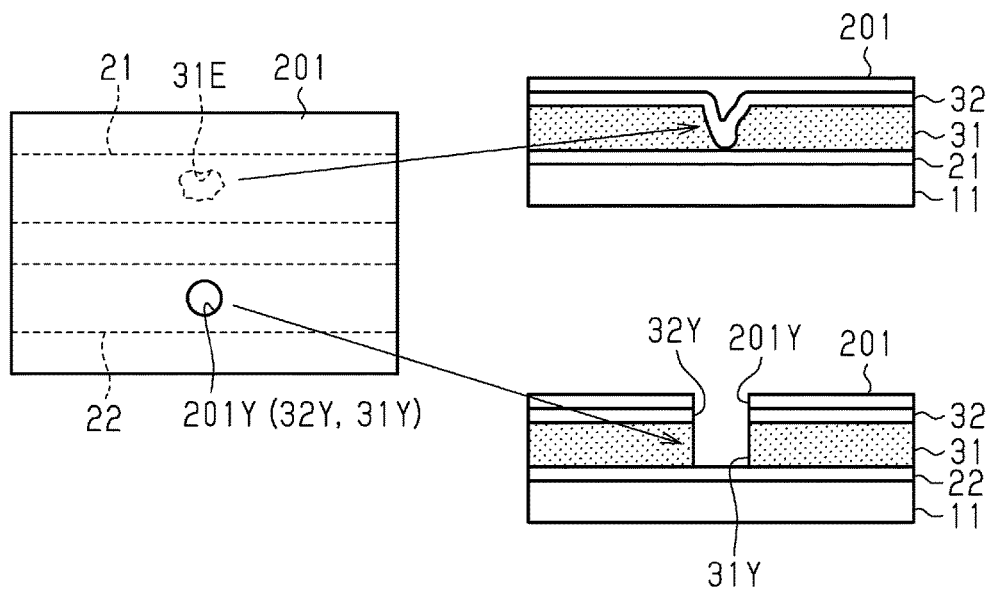

As illustrated in FIG. 8, a resist layer 201 is formed to cover the insulation coating 32. The resist layer 201 functions as a mask in the step of partially removing the insulation coating 32 (FIG. 10). The resist layer 201 may be, for example, a photosensitive dry film resist or a liquid photoresist. Such a resist material may be, for example, a novolac resin or an acrylic resin. For example, when a photosensitive dry film resist is used, the upper surface of the insulation coating 32 is laminated with a dry film through thermo-compression bonding. The dry film is patterned through exposure and development to form the resist layer 201. When a liquid photoresist is used, the resist layer 201 is formed through the same process.

Figure 9:
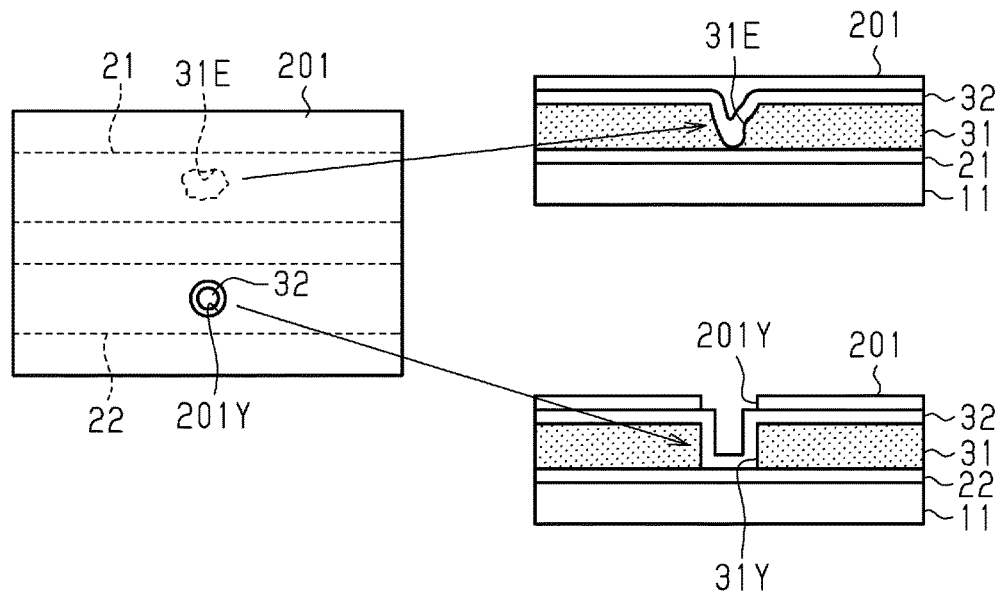

As illustrated in FIG. 9, an opening 201Y is formed. The opening 201Y is formed in a position corresponding to the opening 31Y of the solder resist layer 31. The opening 201Y is formed by patterning the resist layer 201 through exposure and development.

As illustrated in FIG. 10, the insulation coating 32 is removed from the opening 31Y in the solder resist layer 31 to form the opening 32Y in the insulation coating 32. When the insulation coating 32 is an alumina insulation layer, for example, ion milling may be performed to remove the insulation coating 32 from the opening 201Y of the resist layer 201 and form the opening 32Y. When the insulation coating 32 is, for example, a silicon oxide film, the opening 32Y may be formed, for example, by ion milling or dry etching.

Figure 11:
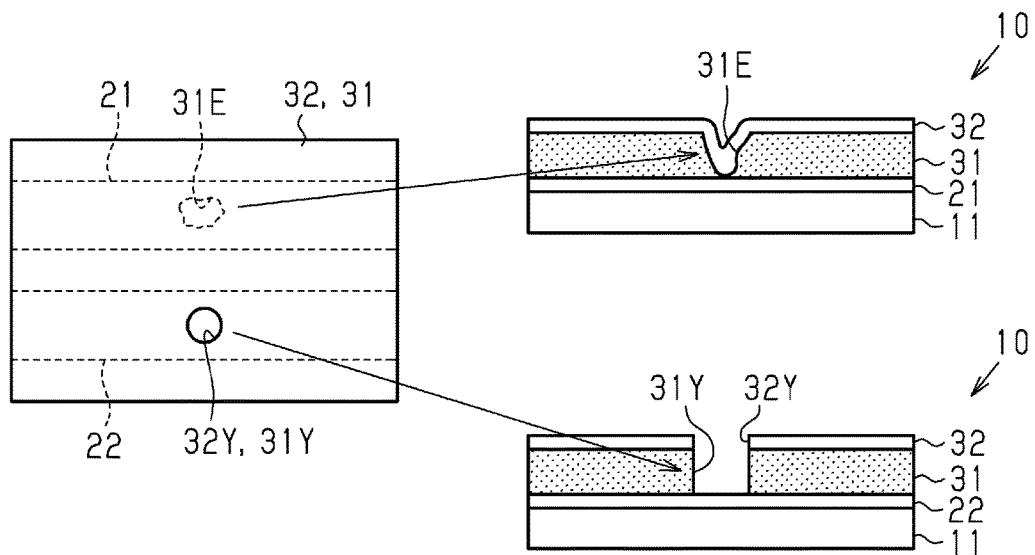
Figure 12:
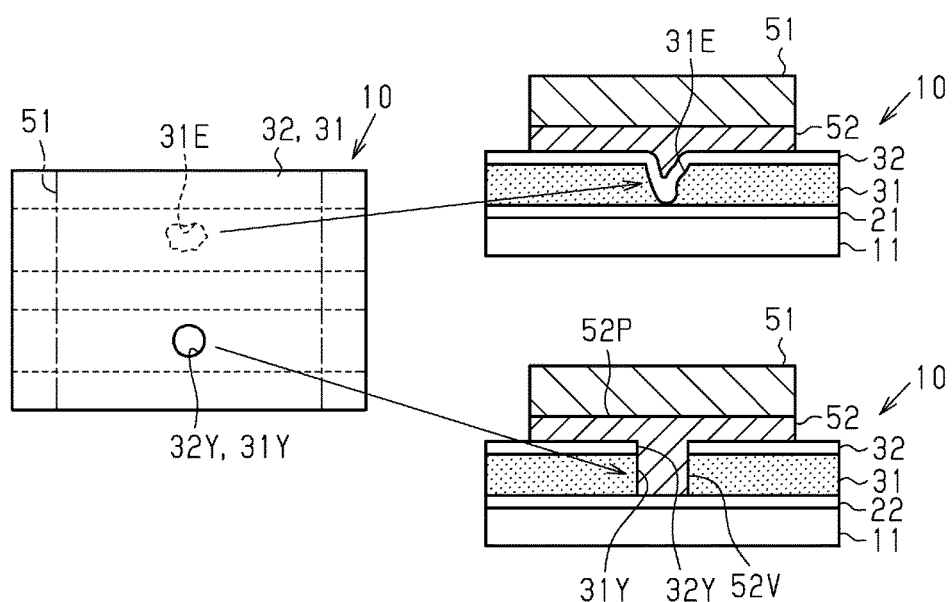
FIG. 12 is an illustrative diagram illustrating a step of connecting a conductive reinforcement plate.

As illustrated in FIG. 11, the resist layer 201 (refer to FIG. 10) is removed. As a result, the wiring substrate 10 including the solder resist layer 31 and the insulation coating 32 is completed.

As illustrated in FIG. 12, the conductive reinforcement plate 51 is adhered to the wiring substrate 10 by the conductive adhesive layer 52. For example, a conductive paste is applied to the lower surface of the conductive reinforcement plate 51, and the conductive reinforcement plate 51 is pushed toward the wiring substrate 10 so that the conductive paste comes into close contact with the insulation coating 32. As a result, the conductive paste fills the opening 32Y in the insulation coating 32, the opening 31Y in the solder resist layer 31, a recess of the insulation coating 32 covering the missing portion 31E. Thereafter, the conductive paste is, for example, heated and cured to form the conductive adhesive layer 52. The conductive adhesive layer 52 includes the adhesive layer 52P and the connecting portion 52V located in the openings 32Y and 31Y. Thus, the conductive reinforcement plate 51 is connected to the ground wiring 22.

The present embodiment has the advantages described below.

(1-1) The wiring substrate 10 includes the substrate body 11, the wiring layer 12 located on the upper surface of the substrate body 11, the solder resist layer 31 covering the wiring layer 12, and the insulation coating 32 covering the upper surface of the solder resist layer 31. The conductive reinforcement plate 51 is adhered to the upper surface of the insulation coating 32 by the conductive adhesive layer 52. The wiring layer 12 includes the signal wiring 21 (first wiring) and the ground wiring 22 (second wiring). At least a portion of the signal wiring 21 and a portion of the ground wiring 22 are located immediately below the conductive reinforcement plate 51. The solder resist layer 31 includes the openings 31Y partially exposing the ground wiring 22 immediately below the conductive reinforcement plate 51. The insulation coating 32 includes the openings 32Y located immediately below the conductive reinforcement plate 51. The openings 32Y are in communication with the openings 31Y and partially expose the ground wiring 22.

The insulation coating 32 covers the entire upper surface of the solder resist layer 31. Even when the solder resist layer 31 has the missing portion 31E in an unintended position, the insulation coating 32 is formed in the missing portion 31E and covers the inner wall of the missing portion 31E and the signal wiring 21 exposed by the missing portion 31E. Thus, even when the conductive adhesive layer 52 fills the missing portion 31E, the insulation coating 32 located between the conductive adhesive layer 52 and the signal wiring 21 electrically insulates the conductive reinforcement plate 51 from the signal wiring 21. This limits short-circuiting of the signal wiring 21 and the ground wiring 22 caused by the missing portion 31E.

(1-2) The insulation coating 32 is formed by an alumina insulation film and covers the entire upper surface of the solder resist layer 31. Thus, even when the solder resist layer 31 has the missing portion 31E at a location other than immediately below the conductive reinforcement plate 51, exposure of the wiring layer 12 caused by the missing portion 31E is limited. Additionally, the insulation coating 32 is thin (for example, 1 m) so that an increase in the total thickness of the solder resist layer 31 and the insulation coating 32 is limited.

Second Embodiment

A second embodiment will now be described with reference to FIGS. 13 to 14.

In the second embodiment, the same reference characters are given to those elements that are the same as the corresponding elements of the first embodiment. Such elements will not be described in detail.

Figure 13:
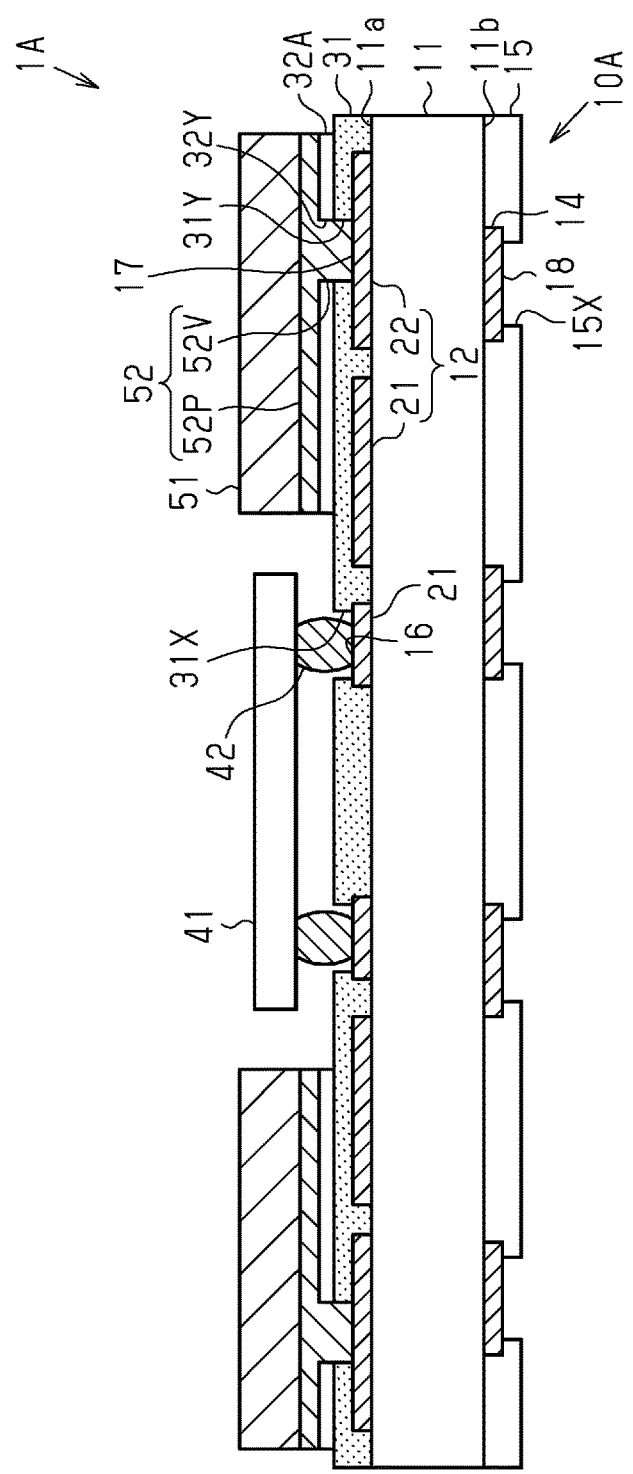
FIG. 13 is a schematic cross-sectional view of a semiconductor device according to a second embodiment.
Figure 14:
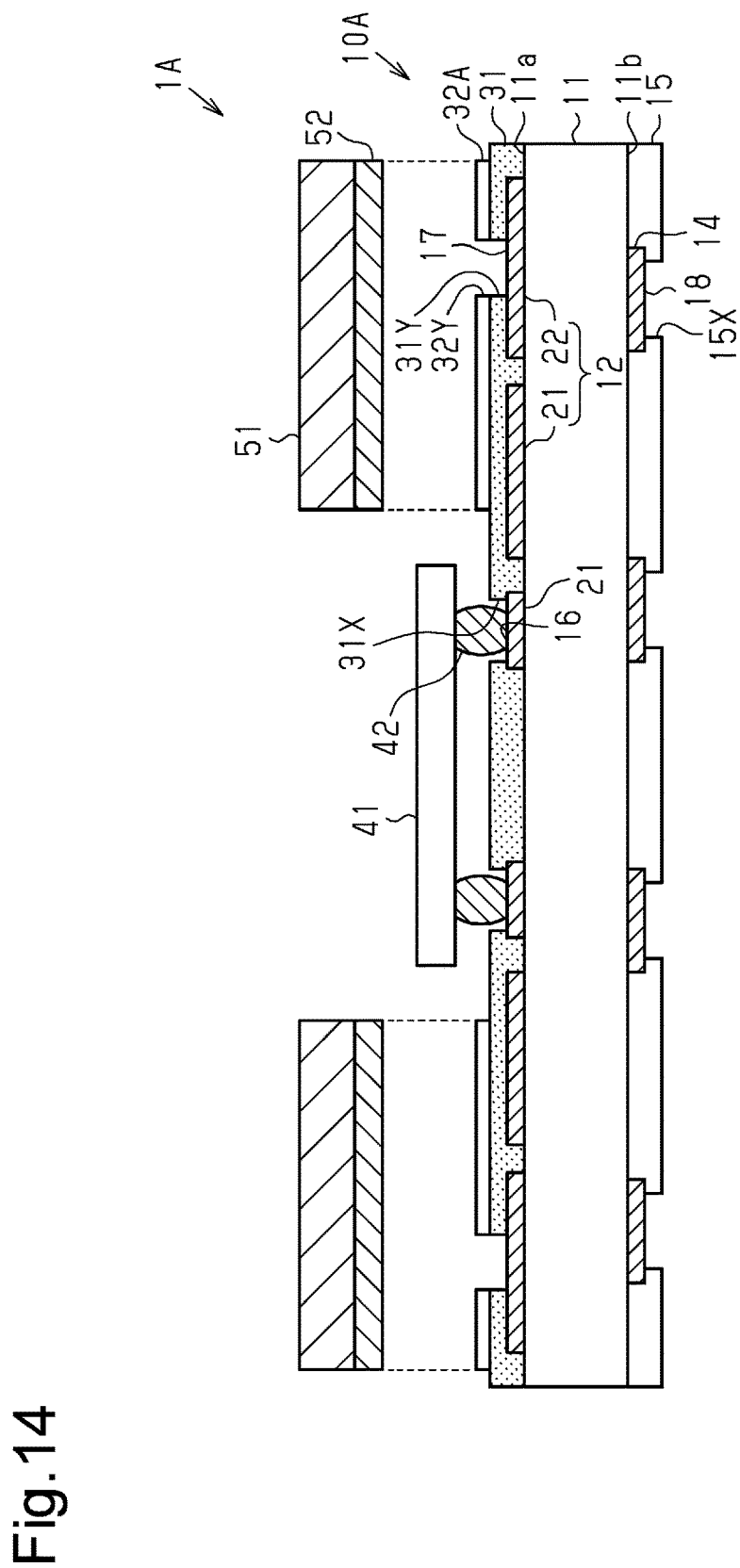
FIG. 14 is a schematic cross-sectional view of a wiring substrate and a reinforcement plate in the semiconductor device illustrated in FIG. 13.

As illustrated in FIGS. 13 and 14, a semiconductor device 1A includes a wiring substrate 10A, the semiconductor element 41 as an electronic component, the conductive reinforcement plate 51, and the conductive adhesive layer 52. The wiring substrate 10A and the wiring substrate 10 of the first embodiment have the same shape.

The wiring substrate 10A includes the substrate body 11, the wiring layer 12, the solder resist layer 31, an insulation coating 32A, the wiring layer 14, and the solder resist layer 15.

The solder resist layer 31 covers the upper surface 11a of the substrate body 11 and a portion of the wiring layer 12. The wiring layer 12 includes the signal wiring 21 (first wiring) and the ground wiring 22 (second wiring). In the second embodiment, the insulation coating 32A and the conductive reinforcement plate 51 have the same shape. The insulation coating 32A is frame-shaped and formed on the upper surface of the solder resist layer 31 to cover the solder resist layer 31 in a region immediately below the conductive reinforcement plate 51.

The solder resist layer 31 is a resin insulation layer formed from an insulative resin. The material of the solder resist layer 31 may be, for example, an epoxy resin or an acrylic resin. In the present example, the insulation coating 32A is formed from an insulative ink material. Examples of the insulative ink material include a printing ink used in laser marking and a letter printing ink for printing a letter or a symbol on the wiring substrate 10A. The insulation coating 32A may be formed, for example, by screen printing or inkjet printing.

The solder resist layer 31 includes the openings 31X and the openings 31Y. The openings 31X partially expose the signal wiring 21 of the wiring layer 12 as the connection pads 16. The openings 31Y partially expose the ground wiring 22 of the wiring layer 12 as the ground pads 17.

The insulation coating 32A includes the openings 32Y, which are in communication with the openings 31Y of the solder resist layer 31 and expose the ground pads 17.

As illustrated in FIG. 13, the conductive reinforcement plate 51 is connected to the upper surface of the insulation coating 32A by the conductive adhesive layer 52.

In the same manner as the first embodiment, the insulation coating 32A of the second embodiment covers the inner wall of the missing portion 31E (refer to FIG. 4), which is formed in the solder resist layer 31, and the signal wiring 21 exposed by the missing portion 31E. This limits short-circuiting of the signal wiring 21 and the ground wiring 22.

The insulation coating 32A is formed from an insulative ink material. Such an insulation coating 32A may be formed by screen printing or inkjet printing. Thus, the insulation coating 32A is easily formed.

The second embodiment has the advantages described below.

(2-1) The wiring substrate 10A includes the solder resist layer 31 covering at least a portion of the signal wiring 21 (first wiring) and at least a portion of the ground wiring 22 (second wiring) and the insulation coating 32A partially covering the upper surface of the solder resist layer 31. In this configuration, the insulation coating 32A covers the inner wall of the missing portion 31E (refer to FIG. 4) formed in the solder resist layer 31 and the signal wiring 21 exposed by the missing portion 31E. This limits short-circuiting of the signal wiring 21 and the ground wiring 22.

(2-2) The insulation coating 32A is formed from an insulative ink material. Such an insulation coating 32A may be formed by screen printing or inkjet printing. Thus, the insulation coating 32A is easily formed.

It should be apparent to those skilled in the art that the foregoing embodiments may be implemented in many other specific forms without departing from the scope of this disclosure. Particularly, it should be understood that the foregoing embodiments may be implemented in the following forms.

In the first embodiment, the insulation coating 32 may cover a portion of the solder resist layer 31. For example, the insulation coating 32 may cover a region corresponding to the conductive reinforcement plate 51 adhered to the wiring substrate 10 by the conductive adhesive layer 52.

In the second embodiment, the insulation coating 32A may cover the entire upper surface of the solder resist layer 31 in the same manner as in first embodiment.

In each embodiment, the insulation coatings 32 and 32A only need to cover the missing portion 31E (void) formed in the solder resist layer 31 and may be formed, for example, by a thermosetting resin such as an epoxy resin. As described above, in the wiring substrate 10 (10A) including the solder resist layer 31 and the insulation coating 32 (32A), exposure of wirings other than the ground wiring 22 is limited. This limits short-circuiting of the signal wiring 21 and the ground wiring 22.

In each embodiment, the wiring substrates 10 and 10A do not include the conductive adhesive layer 52 and the conductive reinforcement plate 51. Instead, the wiring substrates 10 and 10A may include the conductive adhesive layer 52 and the conductive reinforcement plate 51.

In each embodiment and its modified examples, the configurations may be partially replaced with a known configuration. Each embodiment and its modified examples may be partially or entirely combined with other modes and modified examples.

Clauses

This disclosure further encompasses the following embodiments.

1. A method for manufacturing a wiring substrate, the method including:

forming a first wiring and a second wiring on an upper surface of a substrate body;

forming a solder resist layer that covers the first wiring and the second wiring and includes a first opening, the first opening partially exposing the second wiring; and forming an insulation coating covering an inner wall of a missing portion formed in the solder resist layer, the first wiring exposed by the missing portion, and at least a portion of an upper surface of the solder resist layer, wherein the insulation coating includes a second opening that is in communication with the first opening and partially exposes the second wiring.

2. The method according to clause 1, further including adhering a conductive reinforcement plate on an upper surface of the insulation coating with a conductive adhesive layer, wherein the conductive reinforcement plate extends over the first opening, the second opening, at least a portion of the first wiring, and at least a portion of the second wiring in a plan view, the second wiring is electrically connected to the conductive reinforcement plate by the conductive adhesive layer located in each of the first opening and the second opening, and the first wiring is electrically insulated from the conductive reinforcement plate by the insulation coating.

3. The method according to clause 1, wherein the solder resist layer is formed by a resin insulation layer, and the insulation coating is formed by an alumina insulation layer.

4. The method according to clause 1, wherein the solder resist layer is formed by a resin insulation layer, and the insulation coating is formed by an insulative ink material.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A wiring substrate comprising:
    a substrate body;
    a first wiring and a second wiring that are located on an upper surface of the substrate body;
    a solder resist layer that covers the first wiring and the second wiring, the solder resist layer including:
        a first opening that partially exposes the second wiring; and
        a missing portion that partially exposes the first wiring; and
    an insulation coating that covers an inner wall of the missing portion, the first wiring exposed by the missing portion, and at least a portion of an upper surface of the solder resist layer, wherein the insulation coating includes a second opening that is in communication with the first opening and partially exposes the second wiring.

2. The wiring substrate according to claim 1, further comprising a conductive reinforcement plate adhered to an upper surface of the insulation coating by a conductive adhesive layer, wherein the conductive reinforcement plate extends over the first opening, the second opening, at least a portion of the first wiring, and at least a portion of the second wiring in a plan view, the second wiring is electrically connected to the conductive reinforcement plate by the conductive adhesive layer located in each of the first opening and the second opening, and the first wiring is electrically insulated from the conductive reinforcement plate by the insulation coating.

3. The wiring substrate according to claim 1, wherein the solder resist layer includes a resin insulation layer, and the insulation coating includes an alumina insulation layer.

4. The wiring substrate according to claim 1, wherein the solder resist layer includes a resin insulation layer, and the insulation coating includes an insulative ink material.

5. The wiring substrate according to claim 1, wherein the insulation coating covers the entire upper surface of the solder resist layer.

6. The wiring substrate according to claim 5, wherein
the solder resist layer includes a third opening that partially exposes the first wiring as a connection pad to be connected to an electronic component, and
the insulation coating includes a fourth opening that is in communication with the third opening and exposes the connection pad.

7. The wiring substrate according to claim 1, wherein
the insulation coating is frame-shaped and formed on the upper surface of the solder resist layer, and
the solder resist layer includes a third opening that partially exposes the first wiring as a connection pad to be connected to an electronic component.

* * * * *